United States Patent
Horiguchi et al.

(10) Patent No.: US 12,532,550 B2
(45) Date of Patent: Jan. 20, 2026

(54) PHOTOELECTRIC CONVERSION MODULE, PADDLE, AND METHOD FOR MANUFACTURING PHOTOELECTRIC CONVERSION MODULE

(71) Applicant: IDEMITSU KOSAN CO., LTD., Tokyo (JP)

(72) Inventors: Kyohei Horiguchi, Tokyo (JP); Motoshi Nakamura, Tokyo (JP); Mikio Hamano, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 18/697,084

(22) PCT Filed: Sep. 29, 2022

(86) PCT No.: PCT/JP2022/036605
§ 371 (c)(1),
(2) Date: Mar. 29, 2024

(87) PCT Pub. No.: WO2023/054651
PCT Pub. Date: Apr. 6, 2023

(65) Prior Publication Data
US 2024/0405140 A1    Dec. 5, 2024

(30) Foreign Application Priority Data
Sep. 30, 2021  (JP) ................................ 2021-162313

(51) Int. Cl.
*H10F 19/90* (2025.01)
*B64G 1/44* (2006.01)
(Continued)

(52) U.S. Cl.
CPC .......... *H10F 19/902* (2025.01); *B64G 1/443* (2013.01); *H10F 71/00* (2025.01); *H10F 77/1698* (2025.01)

(58) Field of Classification Search
CPC ........ H10F 19/90; H10F 19/902; H10F 71/00; H10F 77/1698
See application file for complete search history.

(56) References Cited

U.S. PATENT DOCUMENTS 4,617,421 A * 10/1986 Nath ....................... H10F 19/30
136/258
4,758,526 A * 7/1988 Thalheimer ............. H10F 19/31
257/E27.125

(Continued)

FOREIGN PATENT DOCUMENTS

JP    H06-140651 A    5/1994
JP    2010-199173 A   9/2010
(Continued)

OTHER PUBLICATIONS

JP 06-140651 A translation as provided by FIT database, translated on Apr. 18, 2025.*

(Continued)

*Primary Examiner* — Golam Mowla
(74) *Attorney, Agent, or Firm* — Foley & Lardner LLP

(57) ABSTRACT

Provided is a photoelectric conversion module capable of improving bonding strength between photoelectric conversion elements adjacent to each other. The photoelectric conversion module (100) comprises a first photoelectric conversion element (10a) including a collector electrode (30a) and a second photoelectric conversion element (10b) including a conductive substrate (20b). The first photoelectric conversion element (10a) and the second photoelectric conversion element (10b) are arranged side by side so as to partially overlap each other. The photoelectric conversion (Continued)

module comprises a conductor (200) electrically connecting the collector electrode (30*a*) of the first photoelectric conversion element (10*a*) and the conductive substrate (20*b*) of the second photoelectric conversion element (10*b*) to each other. The conductor (200) is provided from a region of the collector electrode (30*a*) of the first photoelectric conversion element (10*a*) to a region outside the collector electrode (30*a*).

13 Claims, 7 Drawing Sheets

(51) Int. Cl.
*H10F 71/00* (2025.01)
*H10F 77/169* (2025.01)

(56) References Cited

U.S. PATENT DOCUMENTS

| | | | | |
|---|---|---|---|---|
| 5,385,614 | A * | 1/1995 | Albright | H10F 19/35 257/E27.125 |
| 7,829,785 | B2 * | 11/2010 | Basol | H10F 19/902 136/256 |
| 2004/0035458 | A1 * | 2/2004 | Beernink | H10F 77/215 136/244 |
| 2008/0202584 | A1 | 8/2008 | Basol | |
| 2011/0155209 | A1 | 6/2011 | Tober et al. | |
| 2014/0124013 | A1 | 5/2014 | Morad et al. | |
| 2017/0125619 | A1 | 5/2017 | Nakano et al. | |

FOREIGN PATENT DOCUMENTS

| | | |
|---|---|---|
| JP | 2012-501086 A | 1/2012 |
| JP | 2012-028466 A | 2/2012 |
| JP | 2015-534288 A | 11/2015 |
| JP | 2016-119401 A | 6/2016 |
| WO | WO-2015/152020 A1 | 10/2015 |

OTHER PUBLICATIONS

JP 2010-199173 A translation as provided by FIT database, translated on Apr. 18, 2025.*

International Searching Authority, "International Search Report," issued in connection with International Patent Application No. PCT/JP2022/036605, dated Dec. 20, 2022.

International Searching Authority, "Written Opinion," issued in connection with International Patent Application No. PCT/JP2022/036605, dated Dec. 20, 2022.

Office Action issued in corresponding Japanese Patent Application No. 2023-551885 dated Dec. 2, 2025.

* cited by examiner

PHOTOELECTRIC CONVERSION MODULE, PADDLE, AND METHOD FOR MANUFACTURING PHOTOELECTRIC CONVERSION MODULE

CROSS-REFERENCE TO RELATED APPLICATIONS

The present application claims priority under 35 U.S.C. § 371 to International Patent Application No. PCT/JP2022/036605, filed Sep. 29, 2022, which claims priority to and the benefit of Japanese Patent Application No. 2021-162313, filed on Sep. 30, 2021. The contents of these applications are hereby incorporated by reference in their entireties.

TECHNICAL FIELD

The present invention relates to a photoelectric conversion module, a paddle, and a method for manufacturing a photoelectric conversion module.

BACKGROUND ART

Photoelectric conversion modules that convert light energy into electrical energy are known (Patent Literatures 1 and 2). The photoelectric conversion module described in Patent Literatures 1 and 2 includes a plurality of photoelectric conversion elements. End portions of the photoelectric conversion elements adjacent to each other are overlapped with each other. The photoelectric conversion elements adjacent to each other are electrically connected to each other by a conductor such as solder in a region overlapping each other (see FIG. 5 of Patent Literature 1 and FIG. 3A of Patent Literature 2).

The photoelectric conversion element described in Patent Literature 2 has a collector electrode. The collector electrode includes a plurality of conductive fingers and a conductive bus bar connected to the fingers. In the photoelectric conversion module described in Patent Literature 2, the photoelectric conversion elements adjacent to each other are connected to each other by contact pads formed on the bus bars.

CITATION LIST

Patent Literature

Patent Literature 1: JP 2016-119401 A
Patent Literature 2: JP 2015-534288 A

SUMMARY

When a photoelectric conversion element has a collector electrode including a finger and a bus bar, the photoelectric conversion element is connected to a conductive substrate of the adjacent photoelectric conversion element via a conductor such as solder provided on the bus bar. Here, a width or size of the bus bar is preferably as small as possible from the viewpoint of securing a photoelectric conversion possible region of the photoelectric conversion element. However, when the width or size of the bus bar is small, a contact area between the bus bar and the conductor is also small, so that bonding strength between the photoelectric conversion elements adjacent to each other is reduced.

Therefore, a photoelectric conversion module capable of improving bonding strength between photoelectric conversion elements adjacent to each other and a method for manufacturing the photoelectric conversion module are desired.

A photoelectric conversion module according to one aspect comprises: a first photoelectric conversion element including a collector electrode; and a second photoelectric conversion element including a conductive substrate. The first photoelectric conversion element and the second photoelectric conversion element are arranged side by side so as to partially overlap each other. The photoelectric conversion module comprises a conductor electrically connecting the collector electrode of the first photoelectric conversion element and the conductive substrate of the second photoelectric conversion element to each other. The conductor is provided from a region of the collector electrode of the first photoelectric conversion element to a region outside the collector electrode.

A method for manufacturing a photoelectric conversion module according to one aspect comprises: a step of preparing a first photoelectric conversion element including a collector electrode and a second photoelectric conversion element including a conductive substrate; and a connection step of electrically connecting the first photoelectric conversion element and the second photoelectric conversion element to each other by a conductor. The connection step includes: providing the conductor from a region of the collector electrode of the first photoelectric conversion element to a region outside the collector electrode, and arranging the conductive substrate of the second photoelectric conversion element so as to overlap a part of the collector electrode of the first photoelectric conversion element.

A paddle according to one aspect comprises said photoelectric conversion module.

DESCRIPTION OF EMBODIMENTS

Figure 1:
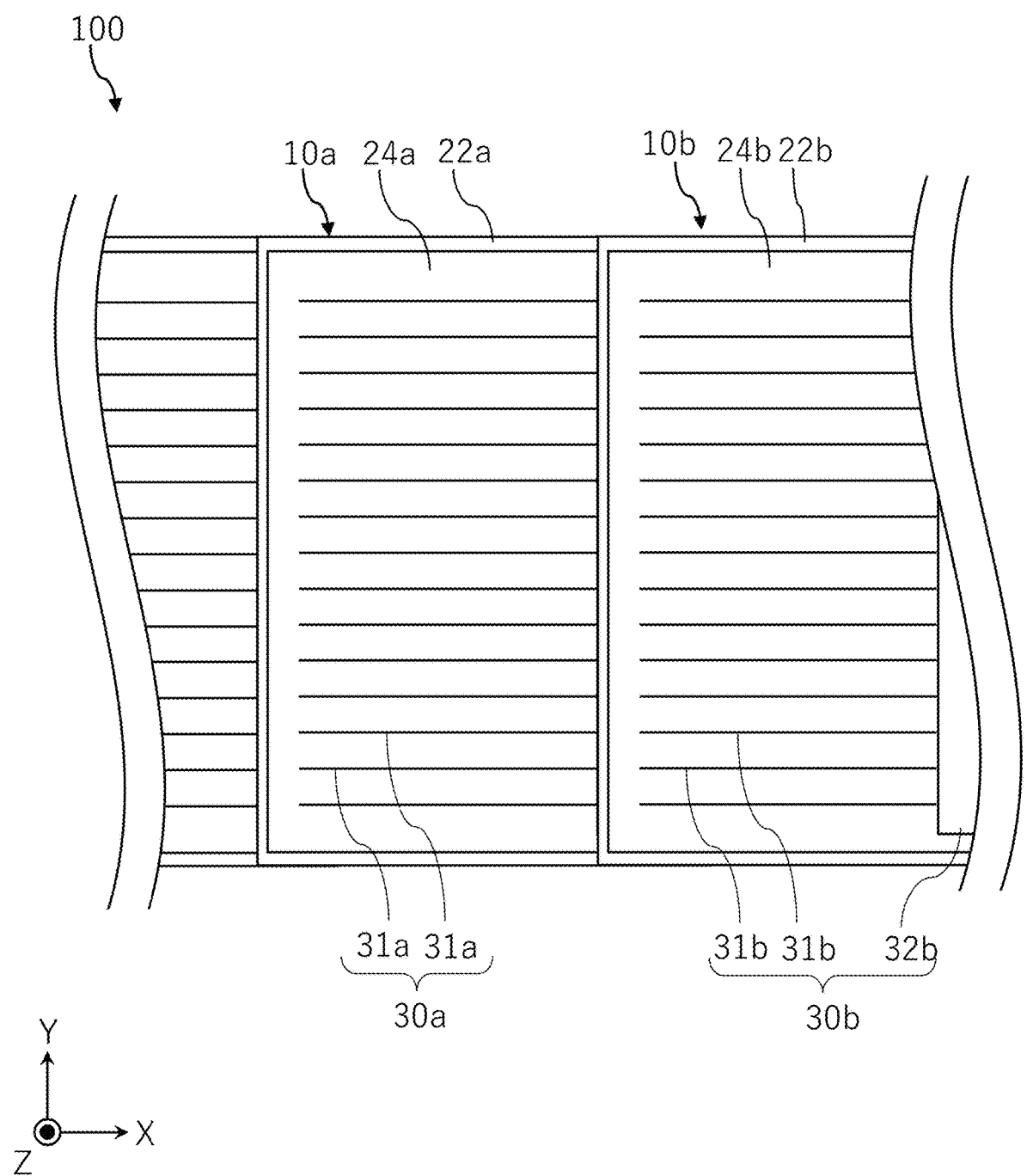
FIG. 1 is a schematic plan view of a photoelectric conversion module according to a first embodiment.

Hereinafter, embodiments will be described with reference to the drawings. In the following drawings, the same or similar parts are denoted by the same or similar reference numerals. However, it should be noted that the drawings are schematic, and ratios of dimensions and the like may be different from actual ones.

First Embodiment

Figure 2:
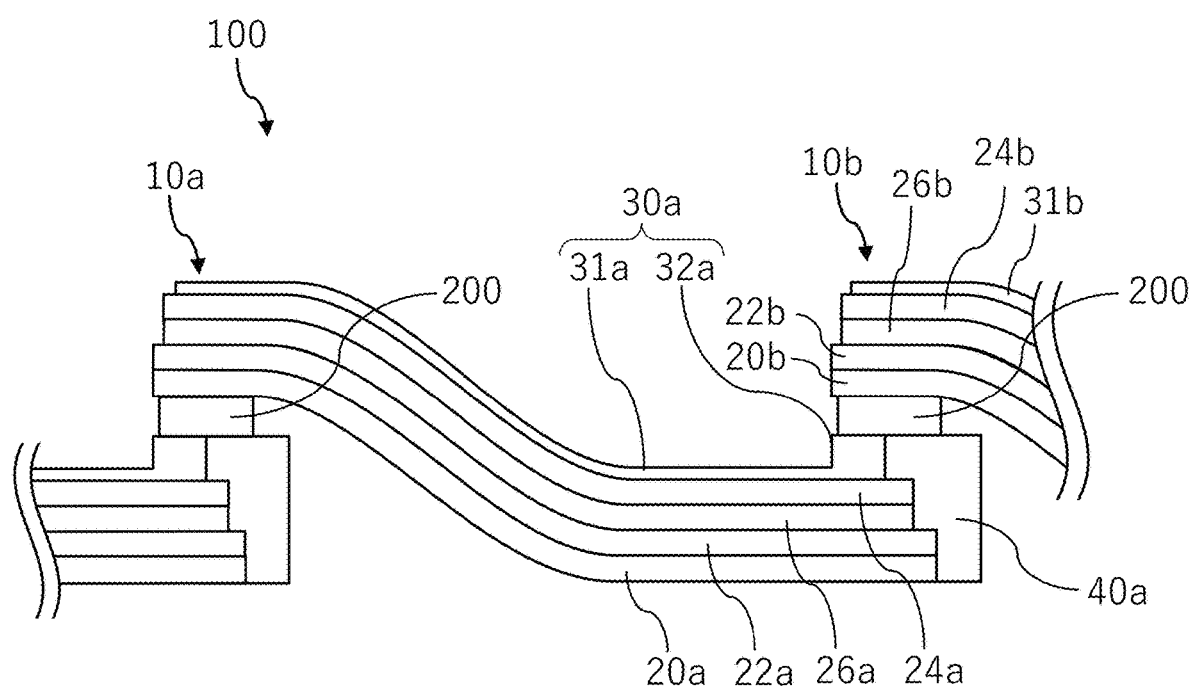
FIG. 2 is a schematic side view of the photoelectric conversion module as viewed from a Y direction in FIG. 1.
Figure 3:
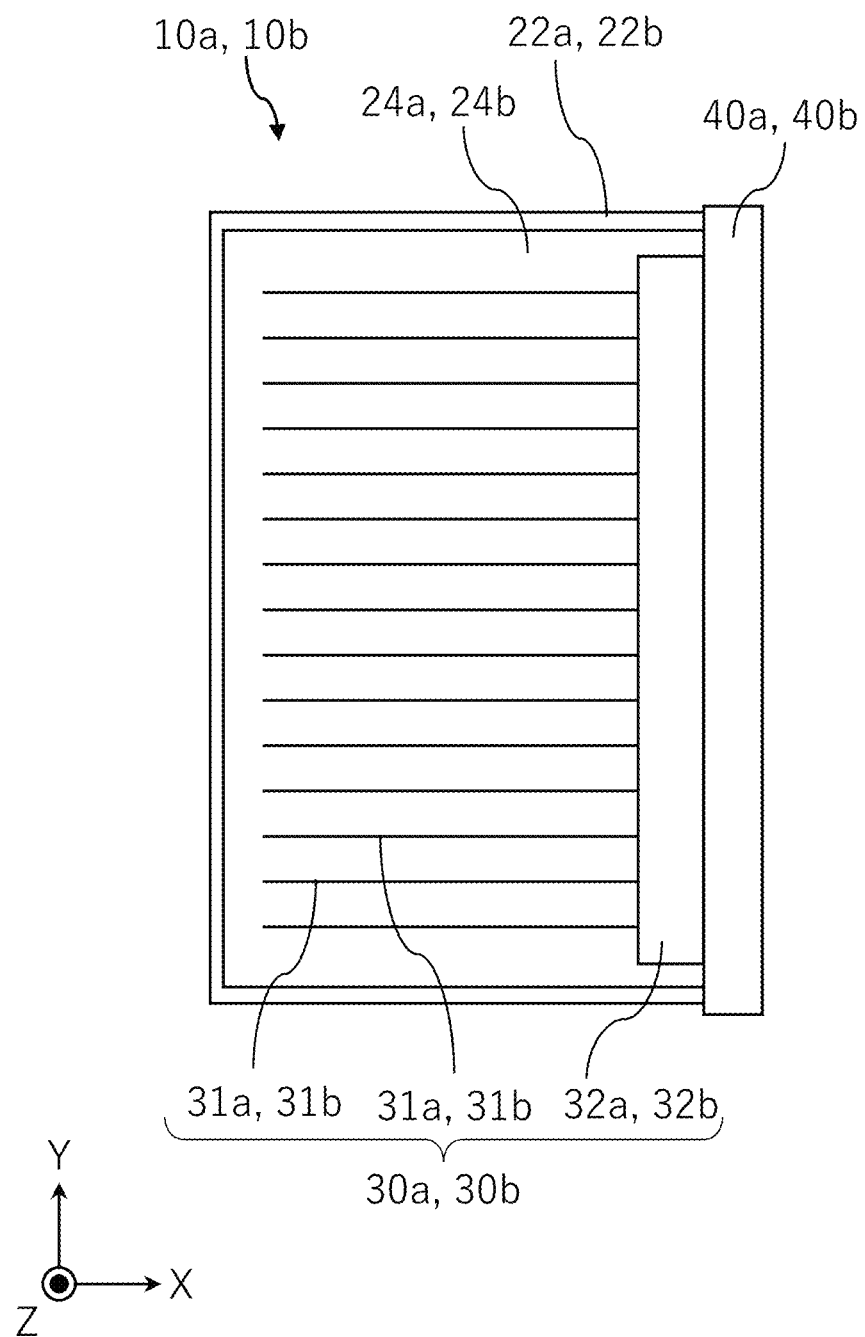
FIG. 3 is a schematic plan view of each photoelectric conversion element constituting the photoelectric conversion module.

FIG. 1 is a schematic plan view of a photoelectric conversion module according to a first embodiment. FIG. 2 is a schematic side view of the photoelectric conversion module as viewed from a Y direction in FIG. 1. FIG. 3 is a schematic plan view of one photoelectric conversion element constituting the photoelectric conversion module. In FIG. 3, in order to describe the structure of each photoelectric conversion element constituting the photoelectric conversion module, it should be noted that reference numerals related to each photoelectric conversion element are given.

A photoelectric conversion module 100 according to the first embodiment includes a plurality of photoelectric conversion elements 10a and 10b, and a conductor 200 that electrically connects the photoelectric conversion elements 10a and 10b adjacent to each other. The plurality of photoelectric conversion elements 10a and 10b is arranged side by side in one direction (X direction in the drawing). The photoelectric conversion elements 10a and 10b adjacent to each other are provided side by side so as to partially overlap each other. Specifically, one end portions of the photoelectric conversion elements 10a and 10b overlap the other end portions of the photoelectric conversion elements 10a and 10b adjacent thereto in a thickness direction. The photoelectric conversion elements 10a and 10b adjacent to each other are electrically connected to each other by the conductor 200 in the overlapping portion. The conductor 200 may be made by a conductive member such as solder or conductive paste. The number of photoelectric conversion elements 10a and 10b arranged in one direction may be at least two, and preferably three or more.

The photoelectric conversion elements 10a and 10b according to the present embodiment may be thin-film photoelectric conversion elements. Preferably, the photoelectric conversion elements 10a and 10b are solar cell elements that convert light energy into electrical energy.

Each of the photoelectric conversion elements 10a and 10b has conductive substrates 20a and 20b serving as bases for forming respective layers such as first electrode layers 22a and 22b described later. The conductive substrates 20a and 20b are constructed by a substrate such as a metal substrate. Further, the conductive substrates 20a and 20b may be flexible substrates. The shapes and dimensions of the conductive substrates 20a and 20b are appropriately determined according to the sizes and the like of the photoelectric conversion elements 10a and 10b.

When a metal substrate is adopted as the conductive substrates 20a and 20b, the conductive substrates 20a and 20b are formed by, for example, titanium (Ti), stainless steel (SUS), copper or aluminum, or an alloy thereof, and so on. Alternatively, the conductive substrates 20a and 20b may have a laminated structure in which a plurality of metal base materials are laminated, and for example, a stainless foil, a titanium foil, or a molybdenum foil may be formed on the surface of the substrate. In order to prevent warpage, a metal material such as molybdenum, titanium, or chromium may be deposited on the back side of the conductive substrates 20a and 20b.

When the conductive substrates 20a and 20b are flexible metal substrates, the photoelectric conversion elements 10a and 10b can be bent, and cracking of the conductive substrates 20a and 20b can also be suppressed due to bending. Furthermore, in the above case, it is easy to reduce the weight and thickness of the photoelectric conversion module 100 as compared with a glass substrate.

The photoelectric conversion elements 10a and 10b may include at least first electrode layers 22a and 22b, second electrode layers 24a and 24b, and photoelectric conversion layers 26a and 26b provided between the first electrode layers 22a and 22b and the second electrode layers 24a and 24b. The photoelectric conversion layers 26a and 26b are layers that contribute to mutual conversion of light energy and electric energy. In a solar cell element that converts light energy into electric energy, the photoelectric conversion layers 26a and 26b may be referred to as light absorption layers.

The first electrode layers 22a and 22b and the second electrode layers 24a and 24b are adjacent to the photoelectric conversion layers 26a and 26b. In the present specification, the term "adjacent" shall mean not only that both layers are in direct contact, but also that both layers are in proximity via another layer.

The first electrode layers 22a and 22b are provided between the photoelectric conversion layers 26a and 26b and the conductive substrates 20a and 20b. The second electrode layers 24a and 24b are located on the side opposite to the conductive substrates 20a and 20b with respect to the photoelectric conversion layers 26a and 26b. Therefore, the photoelectric conversion layers 26a and 26b are located between the first electrode layers 22a and 22b and the second electrode layers 24a and 24b. The first electrode layers 22a and 22b are connected to the conductive substrates 20a and 20b.

In the present embodiment, the second electrode layers 24a and 24b may be constituted by transparent electrode layers. When the second electrode layers 24a and 24b are formed by transparent electrode layers, light incident on the photoelectric conversion layers 26a and 26b or is emitted from the photoelectric conversion layers 26a and 26b passes through the second electrode layers 24a and 24b.

When the second electrode layers 24a and 24b are formed by transparent electrode layers, the first electrode layers 22a and 22b may be formed by opaque electrode layers or may be formed of transparent electrode layers. The first electrode layers 22a and 22b may be formed by, for example, a metal such as molybdenum, titanium or chromium. Although not particularly limited, the thickness of the first electrode layers 22a and 22b may be, for example, 50 nm to 1500 nm.

In the present embodiment, as a preferred example, the second electrode layers 24a and 24b may be formed by an n-type semiconductor, more specifically, a material having n-type conductivity and relatively low resistance. The second electrode layers 24a and 24b can also function as an n-type semiconductor and a transparent electrode layer. The second electrode layers 24a and 24b include, for example, a metal oxide to which a group III element (B, Al, Ga, or In) is added as a dopant. Examples of the metal oxide include ZnO and $SnO_2$. The second electrode layer 24 can be selected from, for example, indium tin oxide ($In_2O_3$:Sn), indium titanium oxide ($In_2O_3$:Ti), indium zinc oxide ($In_2O_3$:Zn), tin zinc-doped indium oxide ($In_2O_3$:Sn, Zn), tungsten-doped indium oxide ($In_2O_3$:W), hydrogen-doped indium oxide ($In_2O_3$:H), indium gallium zinc oxide ($InGaZnO_4$), zinc tin oxide (ZnO:Sn), fluorine-doped tin oxide ($SnO_2$:F), gallium-doped zinc oxide (ZnO:Ga), boron-doped zinc oxide (ZnO:B), aluminum-doped zinc oxide (ZnO:Al), and the like.

Although not particularly limited, the thickness of the second electrode layers 24a and 24b is, for example, 0.5 μm to 2.5 μm.

The photoelectric conversion layers 26a and 26b may include, for example, a p-type semiconductor. In a specific example, the photoelectric conversion layers 26a and 26b may function as, for example, a polycrystalline or microcrystalline p-type compound semiconductor layer. Although not particularly limited, the thickness of the photoelectric conversion layers 26a and 26b is, for example, 1.0 µm to 3.0 µm.

In a specific example, the photoelectric conversion layers 26a and 26b are formed by a chalcogen semiconductor containing a chalcogen element, and function as a polycrystalline or microcrystalline p-type compound semiconductor layer. The photoelectric conversion layers 26a and 26b may be made of, for example, a group I-III-VI$_2$ compound semiconductor having a chalcopyrite structure containing a group I element, a group III element and a group VI element (chalcogen element). Here, the group I element can be selected from copper (Cu), silver (Ag) gold (Au) and the like. The group III element can be selected from indium (In), gallium (Ga), aluminum (Al) and the like. In addition, the photoelectric conversion layers 26a and 26b may contain tellurium (Te) or the like in addition to selenium (Se) and sulfur(S) as the group VI element. In addition, the photoelectric conversion layers 26a and 26b may contain alkali metals such as Li, Na, K, Rb and Cs.

Alternatively, the photoelectric conversion layers 26a and 26b may be made of a group I$_2$-(II-IV)-VI$_4$ compound semiconductor which is a CZTS-based chalcogen semiconductor containing Cu, Zn, Sn, S or Se. Representative examples of the CZTS-based chalcogen semiconductor include those using a compound such as Cu$_2$ZnSnSe$_4$ or Cu$_2$ZnSn(S,Se)$_4$.

The photoelectric conversion layers 26a and 26b are not limited to those described above, and may be made of any material that causes photoelectric conversion.

The photoelectric conversion elements 10a and 10b may include a first buffer layer (not illustrated) between the photoelectric conversion layers 26a and 26b and the first electrode layers 22a and 22b if necessary. The first buffer layer may be a semiconductor material having the same conductivity type as the first electrode layers 22a and 22b, or may be a semiconductor material having a different conductivity type. The first buffer layer may be made of a material having higher electric resistance than the first electrode layers 22a and 22b.

The first buffer layer is not particularly limited, but may be, for example, a layer containing a chalcogenide compound of a transition metal element having a layered structure. Specifically, the first buffer layer may be made of a compound including a transition metal material such as Mo, W, Ti, V, Cr, Nb or Ta and a chalcogen element such as O, S or Se. The first buffer layer may be, for example, Mo(Se, S)$_2$ layer, a MoSe$_2$ layer, MoS$_2$ layer, Cr$_x$TaS$_2$ layer, or the like.

The photoelectric conversion elements 10a and 10b may include a second buffer layer (not illustrated) between the photoelectric conversion layers 26a and 26b and the second electrode layers 24a and 24b if necessary. In this case, the second buffer layer may be a semiconductor material having the same conductivity type as the second electrode layers 24a and 24b, or may be a semiconductor material having a different conductivity type. The second buffer layer may be made of a material having higher electric resistance than the second electrode layers 24a and 24b. The second buffer layer is formed on the photoelectric conversion layers 26a and 26b. Although not particularly limited, the thickness of the second buffer layer is, for example, 10 nm to 100 nm.

The second buffer layer can be selected from compounds containing zinc (Zn), cadmium (Cd) and indium (In). Examples of the compound containing zinc include ZnO, ZnS, Zn(OH)$_2$, or Zn(O,S) and Zn(O,S,OH) which are mixed crystals thereof, and further include ZnMgO and ZnSnO. Examples of the compound containing cadmium include CdS, CdO, or Cd(O,S) and Cd(O,S,OH) which are mixed crystals of CdS and CdO. Examples of the compound containing indium include In$_2$S$_3$ and In$_2$O$_3$, or In$_2$(O,S)$_3$ and In$_2$(O,S,OH)$_3$ which are mixed crystals of In$_2$S$_3$ and In$_2$O$_3$, and In$_2$O$_3$, In$_2$S$_3$, In and the like can be used. The second buffer layer may have a laminated structure of these compounds.

The second buffer layer has an effect of improving characteristics such as photoelectric conversion efficiency, but this can be omitted. When the second buffer layer is omitted, the second electrode layers 24a and 24b are formed directly on the photoelectric conversion layers 26a and 26b.

It should be noted that the laminated structure of the photoelectric conversion elements 10a and 10b is not limited to the above aspect, and may take various aspects. For example, the photoelectric conversion elements 10a and 10b may have a configuration in which both an n-type semiconductor and a p-type semiconductor are sandwiched between the first electrode layer and the second electrode layer. In this case, the second electrode layer may not be made of the n-type semiconductor. In addition, the photoelectric conversion elements 10a and 10b are not limited to the p-n coupling type structure, and may have a p-i-n coupling type structure including an intrinsic semiconductor layer (i-type semiconductor) between an n-type semiconductor and a p-type semiconductor.

The photoelectric conversion elements 10a and 10b include collector electrodes 30a and 30b connected to the second electrode layers 24a and 24b, respectively. The collector electrodes 30a and 30b collect charge carriers from the second electrode layers 24a and 24b, and are formed by a conductive material. The collector electrodes 30a and 30b may be in direct contact with the second electrode layers 24a and 24b. From the viewpoint of securing a power-generatable region, the areas of the collector electrodes 30a and 30b are preferably as small as possible.

The collector electrodes 30a and 30b may have a plurality of substantially linear first portions 31a and 31b and second portions 32a and 32b connected to the plurality of first portions 31a and 31b. The first portions 31a and 31b may be referred to as "fingers". The second portions 32a and 32b may be referred to as "bus bars".

The first portions 31a and 31b are arranged each other at intervals. The first portions 31a and 31b have a function of guiding electric energy (charge carriers) generated in the photoelectric conversion layers 26a and 26b to the second portions 32a and 32b.

In the illustrated aspect, the substantially linear first portions 31a and 31b extend straight along one direction (X direction in the drawing). Alternatively, the first portions 31a and 31b may extend in a wavy line shape or a zigzag polygonal line shape. In the present specification, the term "linear" is defined by a concept including not only a straight line but also an elongated curved line such as a wavy line or a polygonal line.

The plurality of the first portions 31a and 31b of the collector electrodes 30a and 30b may be provided side by side in a first direction (Y direction in the drawing). The plurality of linear first portions 31a and 31b may be connected to the same second portions 32a and 32b. The plurality of first portions 31a and 31b may be provided on one side with respect to the second portions 32a and 32b.

The second portions 32a and 32b of the collector electrodes 30a and 30b may extend along the first direction (Y direction in the drawing). The second portions 32a and 32b may be connected to the first portions 31a and 31b at the end portions of the first portions 31a and 31b. In this case, the plurality of first portions 31a and 31b may extend from the second portions 32a and 32b along a second direction (X direction in the drawing).

The second portions 32a and 32b of the collector electrodes 30a and 30b may extend substantially from the vicinity of one end to the vicinity of the other end of the photoelectric conversion elements 10a and 10b in the first direction (Y direction in the drawing). A width W1 (width in the X direction in the drawing) of the second portions 32a and 32b of the collector electrodes 30a and 30b may be larger than the width (width in the Y direction in the drawing) of the first portions 31a and 31b.

The collector electrodes 30a and 30b (first portions 31a and 31b and second portions 32a and 32b) may be made of a material having higher conductivity than the material constituting the second electrode layers 24a and 24b. As a material constituting the collector electrodes 30a and 30b (first portions 31a and 31b and second portions 32a and 32b), a material having good conductivity and capable of obtaining high adhesion to the second electrode layers 24a and 24b is applied. For example, the material constituting the collector electrodes 30a and 30b can be selected from at least one of indium tin oxide ($In_2O_3$:Sn), indium titanium oxide ($In_2O_3$:Ti), indium zinc oxide ($In_2O_3$:Zn), tin zinc-doped indium oxide ($In_2O_3$:Sn,Zn), tungsten-doped indium oxide ($In_2O_3$:W), hydrogen-doped indium oxide ($In_2O_3$:H), indium gallium zinc oxide ($InGaZnO_4$), zinc tin oxide (ZnO:Sn), fluorine-doped tin oxide ($SnO_2$:F), aluminum-doped zinc oxide (ZnO:Al), boron-doped zinc oxide (ZnO:B), gallium-doped zinc oxide (ZnO:Ga), Ni, Ti, Cr, Mo, Al, Ag, and Cu, or a compound containing one or more of these. The collector electrodes 30a and 30b may be made of an alloy or a laminate made of a combination of the above-described materials.

The second portions 32a and 32b of the collector electrodes 30a and 30b are provided near one end portions of the photoelectric conversion elements 10a and 10b in plan view as viewed from a direction orthogonal to the photoelectric conversion surface (see FIG. 3). The second portions 32a and 32b of the collector electrodes 30a and 30b extend in the Y direction in the drawing along one end portion of the photoelectric conversion elements 10a and 10b at the one end portion.

Each of the photoelectric conversion elements 10a and 10b may have insulating materials 40a and 40b that cover at least a part of the first electrode layers 22a and 22b. The insulating materials 40a and 40b cover at least the end portions of the first electrode layers 22a and 22b in the direction in which the photoelectric conversion elements 10a and 10b are arranged each other. Details of the insulating materials 40a and 40b will be described later.

Next, a structure related to connection between the photoelectric conversion elements 10a and 10b will be described. Hereinafter, one of the photoelectric conversion elements 10a and 10b adjacent to each other may be referred to as a "first photoelectric conversion element", and the other of the photoelectric conversion elements 10a and 10b adjacent to each other may be referred to as a "second photoelectric conversion element". In the illustrated aspect, among the two photoelectric conversion elements adjacent to each other, the photoelectric conversion element 10a on the left side in the drawing is referred to as the "first photoelectric conversion element", and the photoelectric conversion element 10b on the right side in the drawing is referred to as the "second photoelectric conversion element". However, it should be noted that the terms the "first photoelectric conversion element" and the "second photoelectric conversion element" are merely used for convenience to distinguish the elements. Each of the first photoelectric conversion element and the second photoelectric conversion element may have the structure of the photoelectric conversion elements 10a and 10b described above. Therefore, the first photoelectric conversion element and the second photoelectric conversion element may be elements having the same structure.

The conductive substrate 20b of the second photoelectric conversion element 10b is disposed so as to overlap a part of the collector electrode 30a of the first photoelectric conversion element 10a (see FIGS. 1 and 2). Specifically, the conductive substrate 20b of the second photoelectric conversion element 10b may cover at least a part of the second portion 31a of the collector electrode 30a of the first photoelectric conversion element 10a when viewed from the height direction. Here, in the present specification, the height direction is a direction intersecting each film constituting the photoelectric conversion elements 10a and 10b, and corresponds to the Z direction in the drawing.

The second photoelectric conversion element 10b preferably does not cover the first portion 31a of the collector electrode 30a of the first photoelectric conversion element 10a. As a result, the region of the first photoelectric conversion element 10a exposed from the second photoelectric conversion element 10b increases, so that a wide region where photoelectric conversion can be performed by the first photoelectric conversion element 10a can be secured. Therefore, the photoelectric conversion efficiency of the entire photoelectric conversion module 100 can be improved.

The second photoelectric conversion element 10b covers at least a part, preferably the entire second portion 32a of the collector electrode 30a of the first photoelectric conversion element 10a. More preferably, the second photoelectric conversion element 10b is disposed so as to substantially not cover the first portion 31a while substantially entirely covering the second portion 32a of the collector electrode 30a of the first photoelectric conversion element 10a. As a result, the first photoelectric conversion element 10a and the second photoelectric conversion element 10b can be densely arranged such that a region that does not contribute to photoelectric conversion, that is, a region of the second portion 32a is not exposed. Therefore, the size of the photoelectric conversion module as a whole can be reduced without reducing the efficiency of photoelectric conversion.

The conductor 200 electrically connecting the first photoelectric conversion element 10a and the second photoelectric conversion element 10b to each other is provided from the region of the collector electrode 30a, specifically, the second portion 32a of the collector electrode 30a to the region outside the collector electrode 30a (see FIGS. 2 and 3). Here, the region outside the collector electrode 30a on which the conductor 200 is provided may be outside the first portion 31a and the second portion 32a of the collector electrode 30a when viewed from the height direction. Preferably, the conductor 200 may be provided from the region of the first portion 31a of the collector electrode 30a to the region opposite to the first portion 31a with respect to the second portion 32a. The conductor 200 may be provided from the region of the collector electrode 30a to the region outside the collector electrode 30a and covered with the second photoelectric conversion element 10b. In this case, the conductor 200 is located on the back side of the second photoelectric conversion element 10b in plan view as viewed from the height direction.

Since the conductor 200 is provided from the region of the second portion 32a of the collector electrode 30a to the region outside the collector electrode 30a, the region where the conductor 200 is formed becomes wide, and a contact area between the second portion 32a of the collector electrode 30a and the conductor 200 becomes large. Similarly, a contact area between the conductor 200 and the conductive substrate 20b of the second photoelectric conversion element 10b increases. As a result, bonding strength between the photoelectric conversion elements 10a and 10b adjacent to each other is improved, and electrical connection failure hardly occurs.

The conductor 200 is provided from the collector electrode 30a to the insulating material 40a. This makes it possible to secure a wide region where the conductor 200 is provided. In addition, the insulating material 40a suppresses contact of the conductor 200 with a conductive member and suppresses an electrical short circuit.

In the first embodiment, the insulating material 40a is provided from the side portions of the photoelectric conversion layer 26a, the first electrode layer 22a and the conductive substrate 20a in the first photoelectric conversion element 10a to the side portion of the second portion 32a of the collector electrode 30a. This facilitates formation of the conductor 200 over both the second portion 32a of the collector electrode 30a and the insulating material 40a (see FIG. 2).

In the first embodiment, at least a part of the insulating material 40a of the first photoelectric conversion element 10a is provided in a region covered by the second photoelectric conversion element 10b. Specifically, the insulating material 40a covers the end portion of the first electrode layer 22a in the direction in which the first photoelectric conversion element 10a and the second photoelectric conversion element 10b are arranged each other. Preferably, the insulating material 40a covers the end portion of the conductive substrate 20a and the end portion of the first electrode layer 22a of the first photoelectric conversion element 10a in the direction in which the first photoelectric conversion element 10a and the second photoelectric conversion element 10b are arranged each other. More preferably, the insulating material 40a covers the end portions of the conductive substrate 20a, the first electrode layer 22a and the photoelectric conversion layer 26a in the direction in which the first photoelectric conversion element 10a and the second photoelectric conversion element 10b are arranged each other.

Here, the end portions of the conductive substrate 20a and the first electrode layer 22a covered with the insulating material 40a may be a region including a region of the conductive substrate 20a and the first electrode layer 22a protruding outward from the photoelectric conversion layer 26 and a region of an outer edge of the conductive substrate 20a and the first electrode layer 22a when viewed from the height direction. The end portion of the photoelectric conversion layer 26a covered with the insulating material 40a may be a region of the photoelectric conversion layer 26a exposed from the second electrode layer 24a, typically, an outer edge of the photoelectric conversion layer 26a.

In the first embodiment, the sizes (areas) of the conductive substrates 20a and 20b and the first electrode layers 22a and 22b are larger than the sizes (areas) of the photoelectric conversion layers 26a and 26b and the second electrode layers 24a and 24b. Therefore, the end portions of the conductive substrates 20a and 20b and the first electrode layers 22a and 22b extend from the photoelectric conversion layer 26 and the second electrode layer 24. In this case, the insulating material 40a of the first photoelectric conversion element 10a covers portions of the conductive substrate 20a and the first electrode layer 22a extending from the photoelectric conversion layer 26a and the second electrode layer 24a. Thus, the conductive substrate 20b of the second photoelectric conversion element 10b can be prevented from electrically contacting the first electrode layer 22a and/or the conductive substrate 20a of the first photoelectric conversion element 10a. Similarly, when the insulating material 40a covers the region of the photoelectric conversion layer 26a exposed from the second electrode layer 24a, the conductive substrate 20b of the second photoelectric conversion element 10b can be prevented from electrically contacting the photoelectric conversion layer 26a of the first photoelectric conversion element 10a. Therefore, an electrical short circuit between the first photoelectric conversion element 10a and the second photoelectric conversion element 10b can be suppressed.

Instead of the illustrated aspect, the sizes (areas) of the conductive substrate 20a and the first electrode layer 22a may be substantially the same as the sizes (areas) of the photoelectric conversion layer 26a and the second electrode layer 24a. Even in this case, the edges of the conductive substrate 20a and the first electrode layer 22a are exposed from the photoelectric conversion layer 26a and the second electrode layer 24a in the vicinity of the end of the photoelectric conversion element 10a. In this case, the insulating material 40a may cover portions of the conductive substrate 20a and the first electrode layer 22a exposed from the photoelectric conversion layer 26a and the second electrode layer 24a. As described above, the insulating material 40a may also cover the region of the photoelectric conversion layer 26a exposed from the second electrode layer 24a. Even in this case, the conductive substrate 20b of the second photoelectric conversion element 10b can be prevented from electrically contacting the first electrode layer 22a, the conductive substrate 20a and/or the photoelectric conversion layer 26a of the first photoelectric conversion element 10a.

In the first embodiment, the insulating material 40a is in contact with both the second electrode layer 24a and the second portion 32a of the collector electrode 30a (see FIG. 2). Therefore, the insulating material 40a may be provided from the side portions of the first electrode layer 22a and the conductive substrate 20a of the first photoelectric conversion element 10a to the side portion of the second portion 32a of the collector electrode 30a.

Instead of the illustrated aspect, the insulating material 40a of the first photoelectric conversion element 10a may also be present on a part of the second portion 32a of the collector electrode 30a of the first photoelectric conversion element 10a. In other words, a part of the insulating material 40a of the first photoelectric conversion element 10a may exist in a part of the region between the second portion 32a of the collector electrode 30a of the first photoelectric conversion element 10a and the conductive substrate 20b of the second photoelectric conversion element 10b. In this case, it should be noted that the insulating material 40a does not cover the entire second portion 32a of the collector electrode 30a in order to electrically conduct the first photoelectric conversion element 10a and the second photoelectric conversion element 10b.

The conductive substrate 20b of the second photoelectric conversion element 10b may be a flexible substrate as described above. In this case, the conductive substrate 20b of the second photoelectric conversion element 10b may be curved. Specifically, the flexible substrate 20b of the second photoelectric conversion element 10b may have a first end portion connected to the conductor 200 and a second end portion opposite to the first end portion, and the substrate 20b may be curved in the height direction between the first end portion and the second end portion.

That is, the flexible substrate 20b of the second photoelectric conversion element 10b is preferably curved such that the position of the first end portion of the flexible substrate 20b in the height direction (Z direction in the drawing) is shifted from the position of the second end portion of the flexible substrate 20b in the height direction, and the first end portion is substantially parallel to the second end portion. As a result, both ends of the substrate 20b are substantially parallel in the X direction in the drawing, and are not inclined obliquely with respect to the surface of the stage holding the photoelectric conversion module, for example. As a result, the photoelectric conversion elements 10a and 10b adjacent to each other can be bonded to the conductor 200 with a uniform force, and a decrease in adhesive force can be suppressed.

The configurations of the connection portions of the two photoelectric conversion elements 10a and 10b adjacent to each other and the vicinity thereof have been described above. The configuration related to the connection may be applied between arbitrary photoelectric conversion elements 10a and 10b adjacent to each other.

The insulating materials 40a and 40b may be made by, for example, an insulating tape. In this case, the insulating tape may be attached to regions of the photoelectric conversion elements 10a and 10b covered with the photoelectric conversion elements 10a and 10b adjacent thereto.

Alternatively, the material constituting the insulating materials 40a and 40b may include at least one selected from the group including $Al_2O_3$, $Y_2O_3$, $ZrO_2$, MgO, $HfO_2$, $Bi_2O_3$, $TiO_2$, ZnO, $In_2O_3$, $SnO_2$, $Nb_2O_5$, $Ta_2O_5$, $SiO_2$ and $Ca_3(PO_4)_2$. In this case, the insulating materials 40a and 40b can be formed by a known deposition technique such as chemical vapor deposition.

In addition, the insulating materials 40a and 40b may be single insulating layers made of one material, or may be a laminate including layers made of a plurality of materials.

The photoelectric conversion module 100 including the plurality of photoelectric conversion elements 10a and 10b may have a sealing material (not illustrated). The sealing material may be provided to seal the whole of the plurality of photoelectric conversion elements 10a and 10b or a side of the conductive substrates 20a and 20b of the plurality of photoelectric conversion elements 10a and 10b having the above-described configuration.

Second Embodiment

Figure 4:
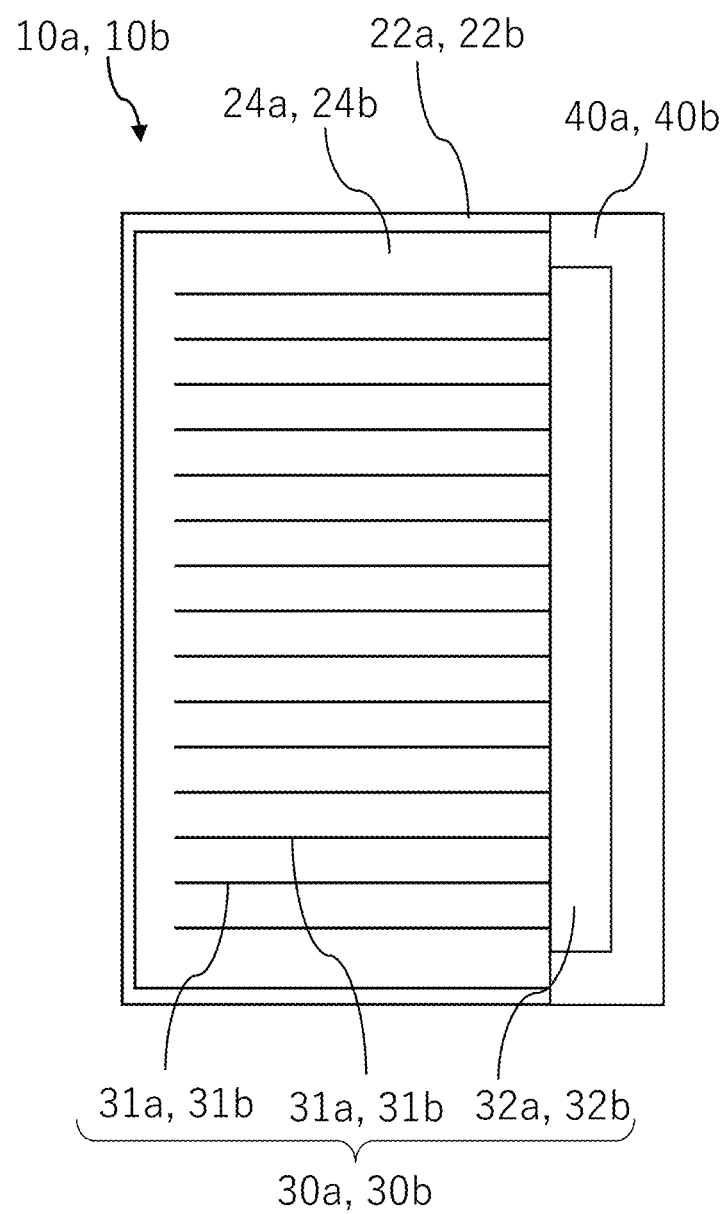
FIG. 4 is a schematic plan view of each photoelectric conversion element constituting a photoelectric conversion module according to a second embodiment.

Next, a photoelectric conversion module according to a second embodiment will be described with reference to FIG. 4. FIG. 4 is a schematic plan view of each photoelectric conversion element constituting the photoelectric conversion module according to the second embodiment. The same reference numerals are given to the same configurations as those of the first embodiment. It should be noted that the description of the same configuration as that of the first embodiment may be omitted.

The second embodiment is different from the first embodiment in a region where the insulating materials 40a and 40b are formed. In the second embodiment, the insulating materials 40a and 40b cover the entire region that is an area of the conductive substrates 20a and 20b and the first electrode layers 22a and 20b exposed from the second electrode layers 24a and 24b and the photoelectric conversion layers 26a and 26b and that is covered by the adjacent photoelectric conversion elements 10a and 10b. In addition, it is preferable that the insulating materials 40a and 40b cover the entire region of the photoelectric conversion layers 26a and 26b exposed from the second electrode layers 24a and 24b, the region covered with the adjacent photoelectric conversion elements 10a and 10b. Therefore, as illustrated in FIG. 4, the insulating materials 40a and 40b are formed in a substantially U shape along the second portions 32a and 32b of the collector electrodes 30a and 30b in plan view.

Accordingly, it possible to more reliably prevent the conductive substrate 20a, the first electrode layer 22a, and/or the photoelectric conversion layer 26a of the first photoelectric conversion element 10 from coming into contact with the conductive substrate 20b of the second photoelectric conversion element 10b.

In the second embodiment, it is preferable that edges (left edges in FIG. 5) of the substantially U-shaped insulating materials 40a and 40b close to the first portions 31a and 31b of the collector electrodes 30a and 30b are located at substantially the same positions as edges (left edges in FIG. 5) of the second portions 32a and 32b of the collector electrodes 30a and 30b on a side connected to the first portions 31a and 31b. Thereby, when the second photoelectric conversion element 10b is disposed so as to substantially not cover the first portion 31a while substantially covering the entire second portion 32a of the collector electrode 30a of the first photoelectric conversion element 10a, it is possible to further suppress the possibility that the first photoelectric conversion element 10a and the second photoelectric conversion element 10b are short-circuited.

Third Embodiment

Figure 5:
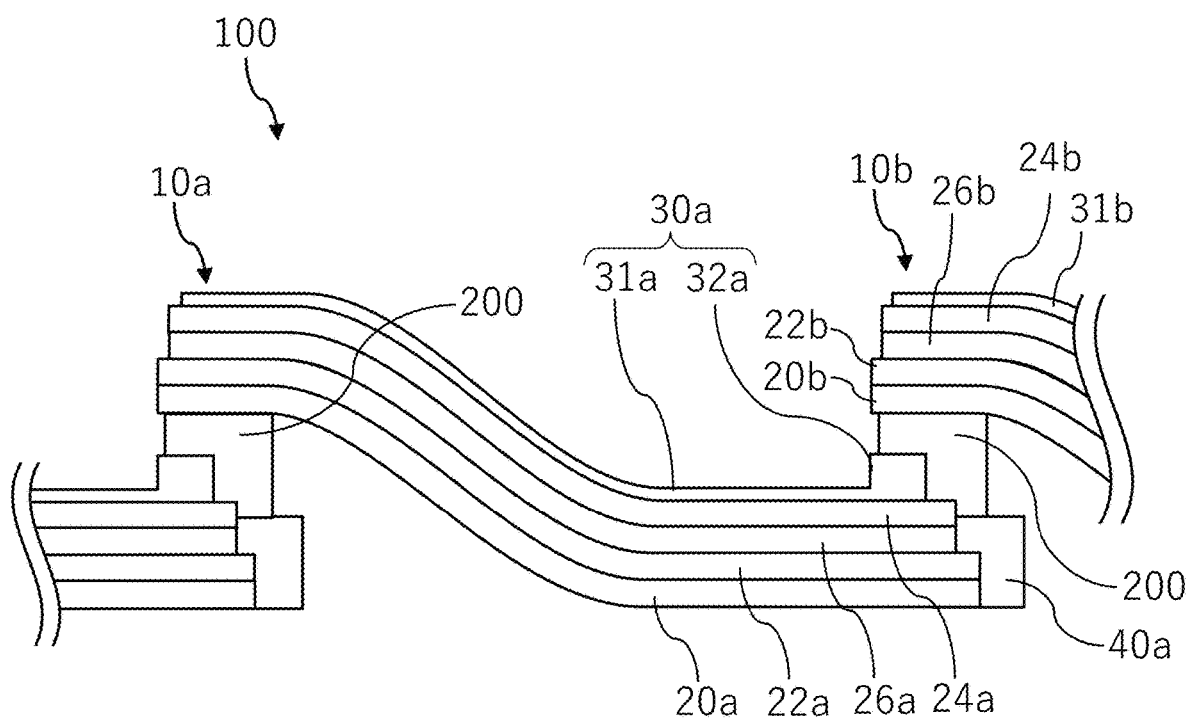
FIG. 5 is a schematic cross-sectional view in which a part of a photoelectric conversion module according to a third embodiment is enlarged.

Next, a photoelectric conversion module according to a third embodiment will be described with reference to FIG. 5. FIG. 5 is a schematic cross-sectional view in which a part of a photoelectric conversion module according to a third embodiment is enlarged. The same reference numerals are given to the same configurations as those of the first embodiment. It should be noted that the description of the same configuration as that of the first embodiment may be omitted.

The third embodiment is different from the first embodiment in a region of an insulating material 40a provided in the first photoelectric conversion element 10a. In the third embodiment, the insulating material 40a is provided on the sides of the conductive substrate 20a, the first electrode layer 22a, the photoelectric conversion layer 26a and the second electrode layer 24a, and is not in contact with the collector electrode 30a. That is, the insulating material 40a does not reach the position of the collector electrode 30a in the height direction. Even in this case, it is possible to suppress the possibility that a region of the conductive substrate 20a and the first electrode layer 22a exposed from the second electrode layer 24a and the photoelectric conversion layer 26a and a region of the photoelectric conversion layer 26a exposed from the second electrode layer 24a come into contact with the conductive substrate 20b of the second photoelectric conversion element 10b.

In the third embodiment, the conductor 200 is provided from the second portion 31a of the collector electrode 30a to the insulating material 40a. In this case, the conductor 200 has a step at the edge of the second portion 31a of the collector electrode 30a in cross-sectional view. As a result, the contact area between the conductor 200 and the first photoelectric conversion element 10a increases, and the adhesion strength of the conductor 200 can be improved.

In the third embodiment, the insulating material 40a covers the conductive substrate 20a and the first electrode layer 22a of the first photoelectric conversion element 10a, and is not in contact with the second electrode layer 24a. Alternatively, the insulating material 40a may be formed over a region in contact with the second electrode layer 24a from the side surfaces of the conductive substrate 20a and the first electrode layer 22a of the first photoelectric conversion element 10a.

In the third embodiment, the first photoelectric conversion element 10a has been described in detail, but photoelectric conversion elements other than the first photoelectric conversion element 10a may have the same configuration.

[Method for Manufacturing Photoelectric Conversion Module]

A method for manufacturing a photoelectric conversion module according to an embodiment will be described. First, the first photoelectric conversion element 10a including the collector electrode 30a and the second photoelectric conversion element 10b including the conductive substrate 20b are prepared. Specifically, the first photoelectric conversion element 10a and the second photoelectric conversion element 10b may comprise the structures of any of the photoelectric conversion elements 10a and 10b described in the above-described embodiment.

In the manufacturing process of each of the photoelectric conversion elements 10a and 10b, the first electrode layers 22a and 22b, the first buffer layer, the photoelectric conversion layers 26a and 26b, the second buffer layer, and the second electrode layers 24a and 24b are formed on the conductive substrates 20a and 20b. In addition, if necessary, a metal material such as molybdenum, titanium or chromium may be formed on the back side of the conductive substrates 20a and 20b in order to prevent warpage. The first buffer layer and the second buffer layer may be formed if necessary.

The first electrode layers 22a and 22b are formed by depositing a material constituting the first electrode layers 22a and 22b on the surfaces of the conductive substrates 20a and 20b, for example, by a sputtering method. The materials constituting the first electrode layers 22a and 22b are as described above. The sputtering method may be a direct current (DC) sputtering method or a radio frequency (RF) sputtering method. In addition, the first electrode layers 22a and 22b may be formed using a chemical vapor deposition (CVD) method, an atomic layer deposition (ALD) method, or the like instead of the sputtering method.

The photoelectric conversion layers 26a and 26b are formed on the first electrode layers 22a and 22b by deposition. In a specific example, the photoelectric conversion layers 26a and 26b are formed, for example, by forming a thin film precursor layer on the first electrode layers 22a and 22b and by chalcogenizing the precursor layer.

The second buffer layer is formed on the photoelectric conversion layer 26 by a method such as a chemical bath deposition (CBD) method, a sputtering method, a CVD method or an ALD method. The material constituting the second buffer layer is as described above.

The second electrode layers 24a and 24b are formed on the second buffer layer by a method such as a sputtering method, a CVD method or an ALD method. Alternatively, when the second buffer layer is not present, the second electrode layers 24a and 24b are formed on the photoelectric conversion layers 26a and 26b. The materials constituting the second electrode layers 24a and 24b are as described above.

Next, collector electrodes 30a and 30b (first portions 31a and 31b and second portions 32a and 32b) are formed on the second electrode layers 24a and 24b. The collector electrodes 30a and 30b can be formed, for example, by applying a printing process such as an inkjet method or a screen printing method in addition to a sputtering method, a CVD method, an ALD method, an AD method, and a vapor deposition method.

Next, if necessary, the insulating materials 40a and 40b are formed on the photoelectric conversion elements 10a and 10b, respectively. The insulating materials 40a and 40b are provided at the desired positions described above by a known vapor deposition method or the like. When the insulating materials 40a and 40b are insulating tapes, the insulating materials 40a and 40b may be attached to desired portions of the photoelectric conversion elements 10a and 10b. The first photoelectric conversion element 10a and the second photoelectric conversion element 10b can be manufactured by the above-described series of steps. The region where the insulating materials 40a and 40b are provided is as described in each of the above embodiments.

Next, a connection step of electrically connecting the first photoelectric conversion element 10a and the second photoelectric conversion element 10b to each other by the conductor 200 is performed. The conductor 200 may be, for example, solder, conductive paste, or the like. The connection step includes providing the conductor 200 from the region of the collector electrode 30a of the first photoelectric conversion element 10a to the region outside the collector electrode 30a, and disposing the conductive substrate 20b of the second photoelectric conversion element 10b so as to overlap a part of the collector electrode 30a of the first photoelectric conversion element 10a. As a result, the second photoelectric conversion element 10b can be connected onto the second portion 32a of the collector electrode 30a of the first photoelectric conversion element 10a via the conductor 200.

By repeating the above connection step, a large number of photoelectric conversion elements can be arranged side by side.

Fourth Embodiment

Figure 6:
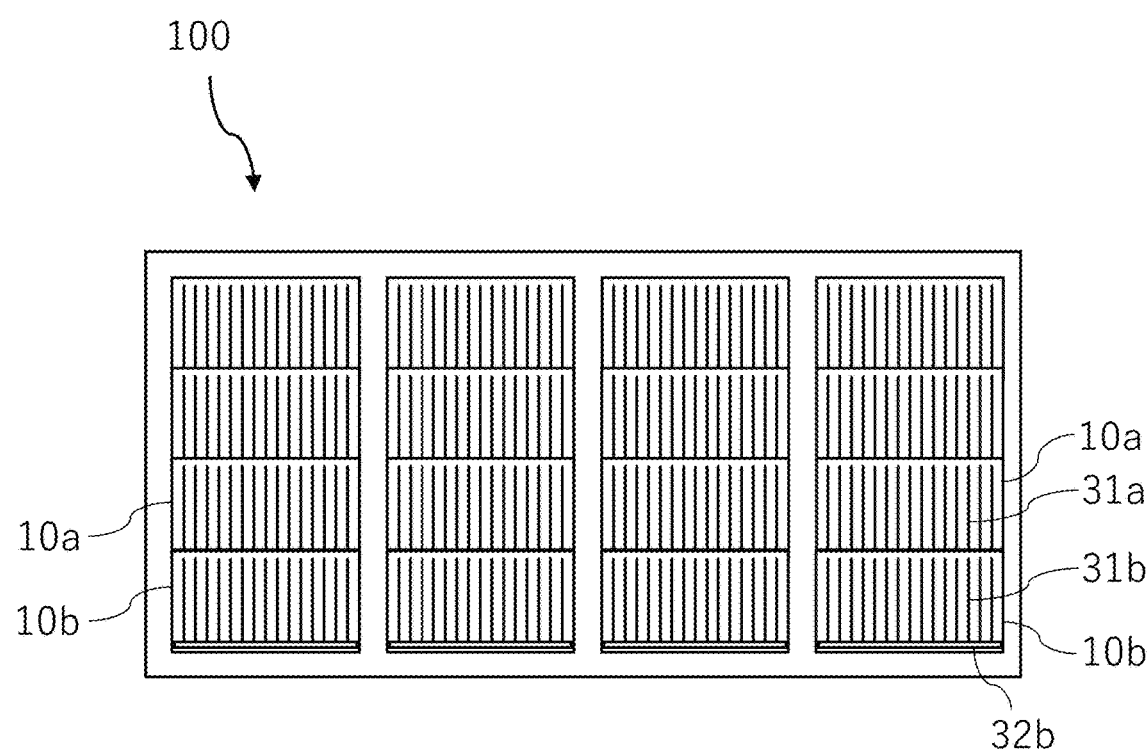
FIG. 6 is a schematic plan view of a photoelectric conversion module according to a fourth embodiment.

Next, a photoelectric conversion module according to a fourth embodiment will be described with reference to FIG. 6. FIG. 6 is a schematic plan view of a photoelectric conversion module according to the fourth embodiment. The same reference numerals are given to the same configurations as those of the first embodiment. It should be noted that the description of the same configuration as that of the first embodiment may be omitted.

The photoelectric conversion module 100 may include one or a plurality of photoelectric conversion elements 10a and 10b. Note that FIG. 6 illustrates the photoelectric conversion module 100 including the plurality of photoelectric conversion elements 10a and 10b. The one or more photoelectric conversion elements 10a and 10b may be sealed with, for example, a sealing material.

When the photoelectric conversion module 100 includes the plurality of photoelectric conversion elements 10a and 10b, the plurality of photoelectric conversion elements 10a and 10b may be arranged in at least one direction, and preferably may be arranged in a lattice pattern. In this case, the plurality of photoelectric conversion elements 10a and 10b may be electrically connected to each other in series and/or in parallel.

In the example illustrated in FIG. 6, the photoelectric conversion elements 10a and 10b are arranged so as to partially overlap each other. Among the photoelectric conversion elements 10a and 10b arranged in one direction, adjacent photoelectric conversion elements partially overlap each other. Specifically, as illustrated in FIG. 6, the second photoelectric conversion element 10b may be disposed so as to cover the second portion 32a of the collector electrode 30a of the first photoelectric conversion element 10a adjacent thereto. In this case, the second photoelectric conversion element 10b is electrically connected to the second portion 32a of the collector electrode 30a of the first photoelectric conversion element 10a adjacent thereto.

[Artificial Satellite and Paddle for Artificial Satellite]

Figure 7:
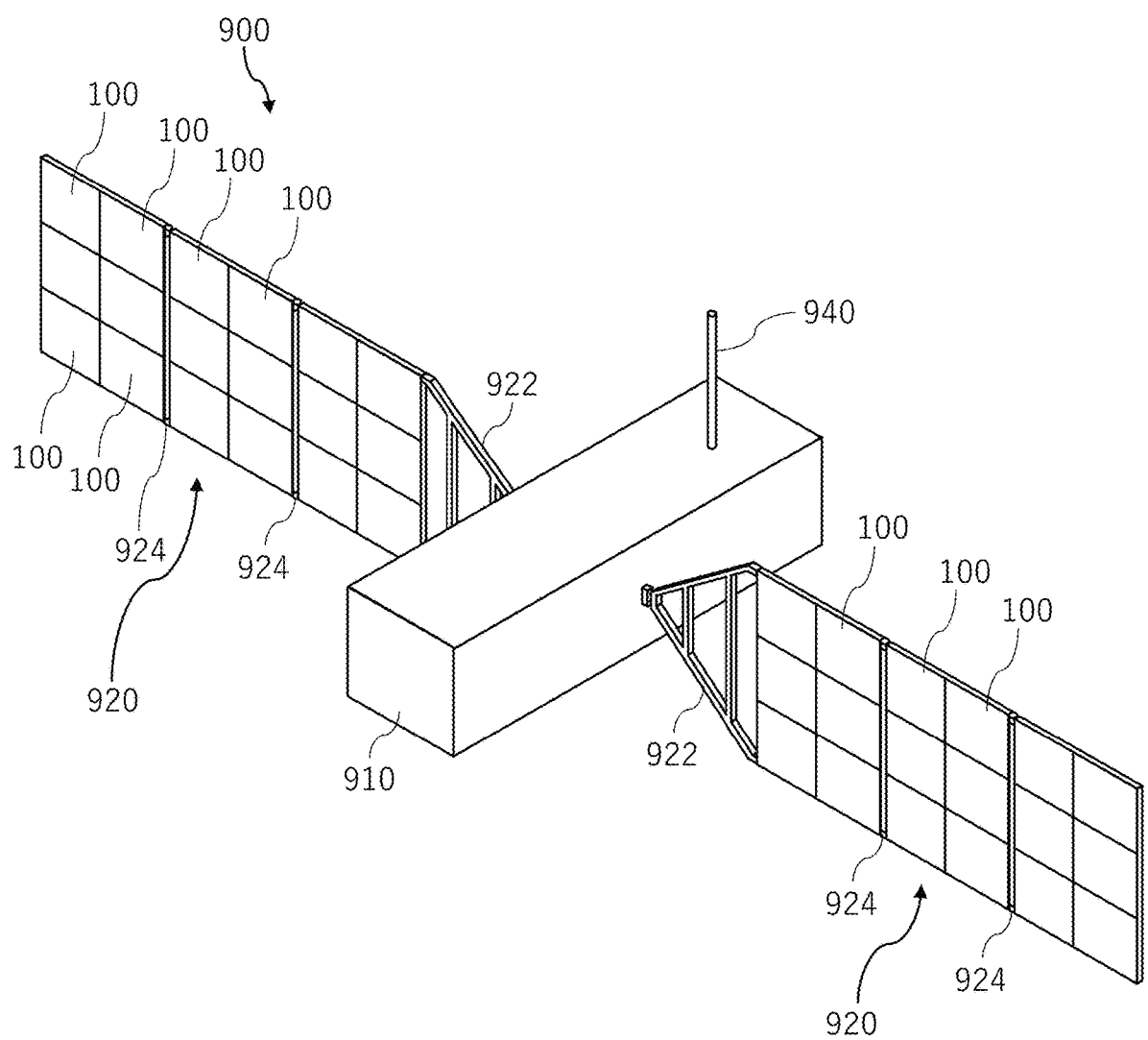
FIG. 7 is a schematic perspective view of an artificial satellite including a photoelectric conversion module.

Next, an artificial satellite including a photoelectric conversion module and a paddle for an artificial satellite will be described. FIG. 7 is a schematic perspective view of an artificial satellite including a photoelectric conversion module. An artificial satellite 900 may have a base portion 910 and a paddle 920. The base portion 910 may include a device (not illustrated) necessary for controlling the artificial satellite 900 and the like. An antenna 940 may be attached to the base portion 910.

The paddle 920 may include the photoelectric conversion module 100 described above. The paddle 920 including the photoelectric conversion module 100 can be used as a power source for operating various devices provided in the base portion 910. As described above, the photoelectric conversion module 100 can be applied to a paddle for an artificial satellite. In particular, since the paddle 920 for an artificial satellite is exposed to a high temperature environment and a severe temperature change environment at the time of launching and operating the artificial satellite, it is desirable to use the photoelectric conversion module 100 including the photoelectric conversion element 10 having high heat resistance described above.

The paddle 920 may include a connecting portion 922 and a hinge portion 924. The connecting portion 922 corresponds to a portion connecting the paddle 920 to the base portion 910.

The hinge portion 924 extends along one direction, and the paddle 920 can be bent with the hinge portion 924 as a rotation axis. Each paddle 920 may have at least one, preferably a plurality of, hinge portions 924. Thus, the paddle 920 including the photoelectric conversion module 100 is configured to be small and foldable. When the artificial satellite 900 is launched, the paddle 920 may be in a folded state. The paddle 920 may be deployed when receiving sunlight to generate power.

Instead of the structure as illustrated in FIG. 7, the paddle 920 may have a cylindrical shape formed by being wound. Accordingly, the paddle 920 can take a substantially flat developed state by the rotation of the wound portion. When the artificial satellite 900 is launched, the paddle 920 may maintain a generally cylindrical shape. The paddle 920 may be unfolded in a substantially flat state when receiving sunlight to generate power.

As described above, the contents of the present invention have been disclosed through the embodiments, but it should not be understood that the description and the drawings constituting a part of the disclosure limit the present invention. From this disclosure, various alternative embodiments, examples, and operational techniques will become apparent to those skilled in the art. Therefore, the technical scope of the present invention is defined only by the matters specifying the invention according to the claims appropriate from the above description.

Each feature described in each of the foregoing embodiments may be applied to or replaced with another embodiment as much as possible. In the above embodiment, the thin-film photoelectric conversion element has been described as an example, but the present invention is not limited thereto, and can be applied to a crystalline photoelectric conversion element as much as possible.

The invention claimed is:

1. A photoelectric conversion module comprising:
a first photoelectric conversion element including a collector electrode; and
a second photoelectric conversion element including a conductive substrate, wherein
the first photoelectric conversion element and the second photoelectric conversion element are arranged side by side so as to partially overlap each other,
the photoelectric conversion module comprises a conductor electrically connecting the collector electrode of the first photoelectric conversion element and the conductive substrate of the second photoelectric conversion element to each other,
the first photoelectric conversion element includes:
a first electrode layer;
a second electrode layer connected to the collector electrode; and
a photoelectric conversion layer between the first electrode layer and the second electrode layer,
when viewed from a direction intersecting a surface of the photoelectric conversion layer, the first electrode layer has a protruding part that protrude from both the photoelectric conversion layer and the second electrode layer,
the first photoelectric conversion element includes an insulating material that covers an end portion of the first electrode layer in a direction in which the first photoelectric conversion element and the second photoelectric conversion element are arranged,
a region of the first electrode layer that is covered with the insulating layer is only the protruding part,
an upper surface of the insulating material is located at a lower level than an upper surface of the second electrode layer,
the conductor is provided from a region of the collector electrode of the first photoelectric conversion element to the second electrode layer and the upper surface of the insulating material, and
the conductor is in direct contact with the upper surface of the insulating material.

2. The photoelectric conversion module according to claim 1, wherein the conductor is provided from the region of the collector electrode to a region outside the collector electrode and covered with the second photoelectric conversion element.

3. The photoelectric conversion module according to claim 1, wherein the collector electrode includes a plurality of substantially linear first portions and a second portion connected to the plurality of first portions, and
the conductive substrate of the second photoelectric conversion element covers at least a part of the second portion.

4. The photoelectric conversion module according to claim 3, wherein the plurality of first portions are provided on one side with respect to the second portion, and the conductor is provided from a region of the second portion of the collector electrode to a region opposite to the first portion with respect to the second portion.

5. The photoelectric conversion module according to claim 1, wherein the first photoelectric conversion element includes a conductive substrate serving as a base of the first electrode layer, and the insulating material covers end portions of the conductive substrate and the first electrode layer of the first photoelectric conversion element in the direction in which the first photoelectric conversion element and the second photoelectric conversion element are arranged.

6. The photoelectric conversion module according to claim 1, wherein the insulating material is in contact with at least one of the second electrode layer and the collector electrode.

7. The photoelectric conversion module according to claim 1, wherein the insulating material is formed by an insulating tape.

8. The photoelectric conversion module according to claim 1, wherein the insulating material includes at least one selected from the group including $Al_2O_3$, $Y_2O_3$, $ZrO_2$, $MgO$, $HfO_2$, $Bi_2O_3$, $TiO_2$, $ZnO$, $In_2O_3$, $SnO_2$, $Nb_2O_5$, $Ta_2O_5$, $SiO_2$ and $Ca_3(PO_4)_2$.

9. The photoelectric conversion module according to claim 1, wherein the conductive substrate of the second photoelectric conversion element is a flexible substrate, the flexible substrate has a first end portion connected to the conductor and a second end portion opposite to the first end portion, and the flexible substrate is curved such that a position of the first end portion of the flexible substrate in a height direction is shifted from a position of the second end portion of the flexible substrate in the height direction, and the first end portion is substantially parallel to the second end portion.

10. A method for manufacturing a photoelectric conversion module, the method comprising:

a step of preparing a first photoelectric conversion element including a collector electrode, a first electrode layer, a second electrode layer connected to the collector electrode, a photoelectric conversion layer between the first electrode layer and the second electrode layer, and an insulating material covering an end portion of the first electrode layer and located at a lower level than an upper surface of the second electrode layer, and a second photoelectric conversion element including a conductive substrate; and a connection step of electrically connecting the first photoelectric conversion element and the second photoelectric conversion element to each other by a conductor, wherein when viewed from a direction intersecting a surface of the photoelectric conversion layer, the first electrode layer has a protruding part that protrude from both the photoelectric conversion layer and the second electrode layer, a region of the first electrode layer that is covered with the insulating layer is only the protruding part, the connection step includes:

providing the conductor from a region of the collector electrode of the first photoelectric conversion element to the second electrode layer and the upper surface of the insulating material so that the conductor is in direct contact with the upper surface of the insulating material, and arranging the conductive substrate of the second photoelectric conversion element so as to overlap a part of the collector electrode of the first photoelectric conversion element.

11. A paddle comprising the photoelectric conversion module according to claim 1.

12. The photoelectric conversion module according to claim 1, wherein the insulating material directly contacts an end of the second electrode layer.

13. The method for manufacturing a photoelectric conversion module according to claim 10, wherein the insulating material is formed to directly contact an end of the second electrode layer.

* * * * *